United States Patent [19]

Miller

[11] Patent Number: 4,683,513
[45] Date of Patent: Jul. 28, 1987

[54] DUAL CURRENT TRANSFORMER CURRENT SENSING METHOD AND SENSOR

[75] Inventor: Robert C. Miller, Salem Township, Westmoreland County, Pa.

[73] Assignee: Westinghouse Electric Corp., Pittsburgh, Pa.

[21] Appl. No.: 848,541

[22] Filed: Apr. 7, 1986

[51] Int. Cl.⁴ .............................................. H02H 3/26
[52] U.S. Cl. ........................................ 361/76; 361/44; 361/50; 361/87; 361/93; 307/131; 340/658; 340/664; 324/86
[58] Field of Search ................ 361/23, 31, 44, 50, 361/76, 35, 87, 93; 307/127, 131; 340/664; 336/174, 175; 324/86, 108

[56] References Cited

U.S. PATENT DOCUMENTS

| | | | |
|---|---|---|---|
| 3,729,650 | 4/1973 | Cook | 361/35 |
| 4,172,244 | 10/1979 | Zeis | 336/174 X |
| 4,356,443 | 10/1982 | Emery | 361/31 X |
| 4,454,557 | 6/1984 | Hurley | 361/93 |
| 4,513,274 | 4/1985 | Halder | 336/174 X |
| 4,542,432 | 9/1985 | Nichols, III et al. | 361/44 |

*Primary Examiner*—A. D. Pellinen
*Assistant Examiner*—Derek S. Jennings
*Attorney, Agent, or Firm*—M. J. Moran

[57] ABSTRACT

A current sensor for use in a three phase ac system for producing a signal indicative of the average value of the sum of the squares of the ac current and of the phase imbalance between the three phases using two current transducers and an associated method.

10 Claims, 3 Drawing Figures

DUAL CURRENT TRANSFORMER CURRENT SENSING METHOD AND SENSOR

CROSS-REFERENCE TO RELATED APPLICATIONS

The material presented herein is related to the material presented in the copending application Ser. No. 848,522, filed Apr. 7, 1986, 1986 entitled "Mutual Inductor Current Sensor", R. C. Miller.

FIELD OF THE INVENTION

The invention disclosed herein relates to ac current sensors and in particular to current sensors used in motor protection schemes.

BACKGROUND OF THE INVENTION

Overload protection for motors has been traditionally accomplished with the use of thermo-mechanical assemblies (heaters and bimetallic strips) which give a crude approximation of internal motor heating. The protection system monitors each of the phase currents that drive the motor and will trip or disconnect the motor from the line in a time which is inversely proportional to the square of the largest phase current. This is normally referred to as the $I^2t$ characteristic. Although low in cost, the thermo-mechanical assembly does have drawbacks. As the ambient temperature varies, the current trip characteristics of the heaters and bimetallic strips also change. The $I^2t$ trip characteristic of the system even at room temperature is only a rough model of motors heating due to an overload. Lastly, the technique does not lend itself very well to detecting motor heating due to phase imbalance or phase loss.

Motor protection designers have been looking for an alternative that is more accurate but competitive in cost with the thermo-mechanical assembly. Solid state electronics is an area of interest for the modular overload relay (MOR) designer because there is an ever-growing trend toward putting more calculative power in a smaller area for a smaller price. If a solid state MOR is used, then the method of sensing the current fed to the motor should change to take advantage of the "real time" monitoring capability that is intrinsic in the MOR device. Presently, in three phase, three wire systems, current transformers, which are placed around each phase conductor in the three wire system, are used. This arrangement is immune to ambient temperature effects and phase loss detection is possible. However, the requirement of using three current transformers in addition to the MOR device results in a more costly system than that of the thermo-mechanical assembly. Accordingly, it would be advantageous if the cost of the solid state protection system could be reduced. One means of accomplishing this would be to reduce the number of current sensors required. It is an object of the present invention to set forth the description of one approach that can be used for providing the current and phase information while reducing the number of current sensors required to obtain this information. Another object is to provide a current sensor producing signals which can be readily processed to provide the desired current and phase information.

SUMMARY OF THE INVENTION

The invention is a method and current sensor for producing a signal indicative of the average value of the square of the three ac phase currents and of phase imbalance. Two current transformers, each comprising a secondary winding and a toroidal magnetic core adapted to receive the secondary winding and having a window therethrough for receiving one or more current carrying conductors is utilized. The current sensor is installed in series in the current carrying conductors of a three phase ac line that supply a three phase load. A first, second and third conductor portion are provided in the sensor. The ends of each conductor portion are adapted to be connected in series with the current-carrying conductors, one conductor portion per phase. The first conductor portion is passed twice through the window of the first current transformer. The second and third conductor portions are passed in the same direction through the window of the first current transformer. The current flow in the second and third conductor portions is in same direction where they pass through the first current transformer. The direction of current flow in the first conductor portion is opposite to that of the second and third conductor portions. The second and third conductor portions are then passed through the window of the second current transformer such that the direction of current flow in one of the conductor portions where it passes through the window is opposite to the direction of current flow of the other conductor portion. In an alternate embodiment, the first conductor portion is passed through the window of the first current transformer. The second and third conductor portions pass through the window of the second current transformer. The second and third conductor portions are arranged within the window of the second current transformer so that the direction of current flow in one of the conductor portions where it passes through the window is opposite the direction of current flow in the other conductor portion.

With either embodiment of the sensor, squaring circuits are provided for squaring the outputs of the secondary winding of the first and second current transformers. In the first embodiment the relative number of turns on the two current transformers and the relative gain of the two squaring circuits is adjusted so that a given current through a conductor passing through the second current transformer will produce an output from its respective squaring circuit which is 3 times that produced by the same current flowing in a conductor passing through the first current transformer at the output of its respective squaring circuit. In the alternative embodiment the relative number of turns on the two current transformers and the relative gain of the two squaring circuits is adjusted so that a given current through a conductor passing through the second current transformer will produce an output from its respective squaring circuit which is $\Delta$ that produced by the same current flowing in a conductor passing through the first current transformer at the output of its respective squaring circuit These squared outputs are then summed together with the resulting summation having a dc term proportional to the current flow in three phases and an ac term proportional to the phase imbalance. The dc term is substantially proportional to the average value of the sum of the squares of the current flowing in the conductors. The ac term is at twice line frequency and is substantially proportional to the product of the negative and positive sequence currents. This ac term is a non-zero term when a phase imbalance condition exists. The dc term of the summed outputs can be integrated to provide an inverse time current ($I^2t$) signal. Further, a two-times-line-frequency pass filter can be used to eliminate the dc term to provide a filtered ac signal that is indicative of the amount of phase imbalance.

BRIEF DESCRIPTION OF THE DRAWINGS

For a better understanding of the invention, reference may be made to the embodiments exemplary of the invention shown in the accompanying drawings wherein.

DETAILED DESCRIPTION

Figure 1:
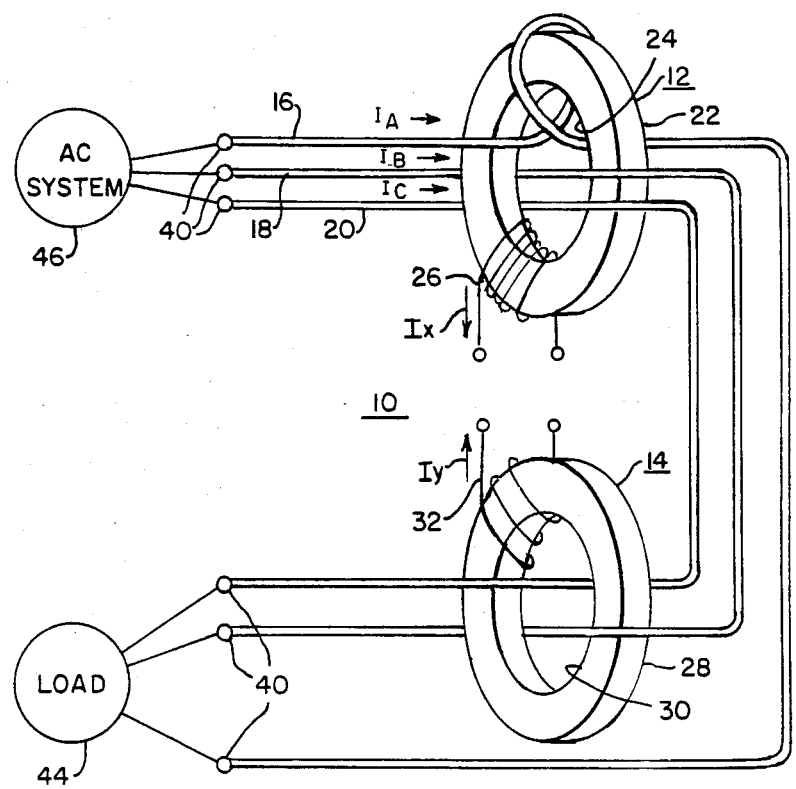
FIG. 1 is an illustration of a current sensor embodying the present invention.

The current sensor 10 of the present invention as shown in FIG. 1 is comprised of two current transformers 12, and 14 and a first, second and third conductor portions 16, 18 and 20. The current transformer 12 is comprised of a magnetic core 22, typically toroidal in shape, having a window 24 or aperture therethrough for receiving a conductor portion. A secondary winding 26 is wound on the core 22 providing an output signal. The other current transformer 14 is similarly constructed having a core 28 with a window 30 therein and secondary winding 32 wound thereon. The number of turns in the secondary winding 32 of the current transformer 14 is substantially equal to the $1/\sqrt{3}$ times the number of turns in the secondary winding 26 of the current transformer 12.

For the sensor 10, the first 16, second 18 and third 20 conductor portions that serve as the primary windings are arranged in the following manner. For the purposes of illustration, the first through third conductor portions are assumed to be the phases A, B and C, respectively, having phase currents $I_A$, $I_B$ and $I_C$, respectively. The conductor portion 16 passes twice through the core window 24 while the conductor portions 18 and 20 pass only once through the window 24. The current flow in the conductor portions 18 and 20 are in the same direction where they pass through the window 24. The current flow in the first conductor portion 16 is opposite to that in the conductor portions 18 and 20. At the current transformer 14, the current carrying conductor portions 18 and 20 are arranged so that the direction of current flow in the second conductor portion 18 where it passes through the window 30 is opposite in direction to the direction of current flow in the third conductor portion 20 where it passes through the window 30. The current carrying portion 16 does not pass through the window 30 of the core 14 of the current transformer 32. The ends 40 of each of the conductor portions are adapted to be connected in series with the current carrying conductors that supply an electrical load 44 from an ac system 46. The current sensor 10 is inserted in series between the system 46 and load 44 in order to monitor the current flowing into the load 44. The current sensor 10 can be used with a four wire, three phase ac system having zero sequence components as well as in the three wire, three phase ac system.

Figure 2:
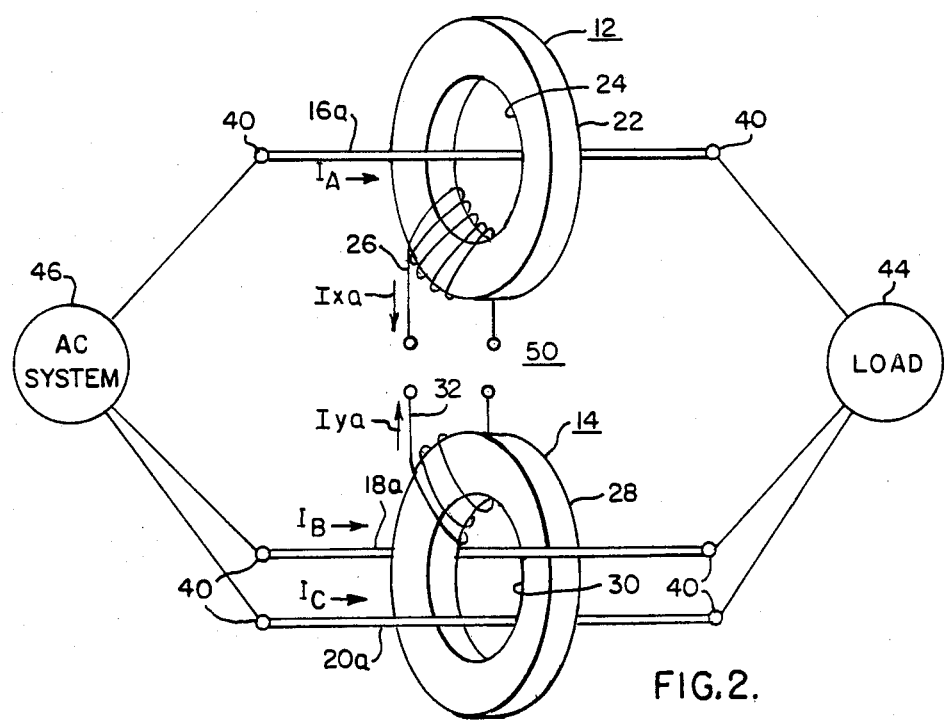
FIG. 2 shows an alternate embodiment of the invention.

In FIG. 2 an alternate embodiment of the invention is illustrated. In this embodiment the arrangement of the current carrying conductor portions is simplified somewhat from that illustrated in FIG. 1. The remaining elements are substantially the same as shown in FIG. 1 and therefore carry the same reference characters. Again the current sensors 50 comprises two current transformers 12 and 14. Here the number of turns in the secondary winding 32 of the current transformer 14 is substantially equal to $\sqrt{3}$ times the number of turns in the secondary winding 26 of the current transformer 12. The first conductor portion 16a passes through the window 24 of the current transformer 12. The second conductor portion 18a and third conductor portion 20a pass through the window 30 in the second current transformer 14. These latter two conductor portions are arranged so that the direction of current flow in the second conductor portion 18a where it passes through the window 30 is opposite in direction to the direction of current flow in the third conductor portion 20a where it passes through the window 30. The current sensor 50 is used with a three wire, three phase ac system that does not have any zero sequence components. Although the conductor portions differ in their arrangement, the current sensor 50 and its output is the equivalent of the current sensor 10 shown in FIG. 1 when both are used in three wire, three phase ac systems.

The operation of the current sensor 10 and the current sensor 50 is easy to understand if one notes that the ac currents flowing in the conductors portions 16, 18 and 20 will induce currents Ix and Iy in the secondary windings 26 and 32, respectively, and conductor portions 16a, 18a, 20a will induce currents Ixa and Iya in the secondary windings 26 and 32, respectively. In each case the currents are substantially proportional to a linear combination of the line currents, $I_A$, $I_B$, and $I_C$. The two output current signals Ix and Iy or Ixa and Iya from the secondary windings 26 and 32, respectively, contain sufficient information so that when properly processed they can be used to provide trip signals on the basis of line currents or phase imbalance.

Quantitatively it can be shown that if the currents through the load are definable by the positive, negative and zero order sequence currents, Ip, In, and Io, respectively, given in equations (1) through (3):

$$I_A = Ip \sin \omega t + In (\sin \omega t + \phi) + Io \sin (\omega t + \theta) \qquad (1)$$

$$I_B = Ip \sin (\omega t + 120) + In \sin (\omega t + \phi - 120) + Io \sin (\omega t + \theta) \qquad (2)$$

$$I_C = Ip \sin (\omega t + 240) + In \sin (\omega t + \phi - 240) + Io \sin (\omega t + \theta) \qquad (3)$$

then for current sensor 10 shown in FIG. 1, Ix and Iy are as given in equations (4) and (5):

$$Ix = 3 \beta x [Ip \sin \omega t + In \sin (\omega t + \phi)] \qquad (4)$$

$$Iy = \sqrt{3} \beta y [Ip \cos \omega t - In \cos (\omega t + \phi)]. \qquad (5)$$

and for current sensor 50 shown in FIG. 2, Ixa and Iya are as given in equations (6) and (7):

$$Ixa = \beta x [Ip \sin \omega t + In \sin (\omega t + \phi) + Io \sin (\omega t + \theta)] \qquad (6)$$

$$Iya = \sqrt{3} \beta y [Ip \cos \omega t - In \sin \omega t] \qquad (7)$$

In equations (4)–(7) $\beta x$ is the turns ratio of the current transformer 12. $\beta y$ is defined in the same fashion for the current transformer 14. For current sensor 10 the relationship between the turns ratios of the transformers is given in equation (8):

$$\beta x = \beta y / \sqrt{3} \qquad (8)$$

For current sensor 50 the relationship between the turns ratios of the transformers is given in equation (9):

$$\beta x = \sqrt{3} \, \beta y \qquad (9)$$

The difference is the relationships of the turns ratios for the two current sensors 10 and 50 is due to the difference in the number of the conductor portions that pass thru the windows in the cores of the transformers. For either of the current sensors, the turns ratios of the two transformers can be made so that they are equal to one another. However in this case the processing circuit used with the sensor must be modified as described hereinafter.

The sum of the squares of the output currents of Ix and Iy is given in equation (10) for current sensor 10.

$$Ix^2 + Iy^2 = 9 \, \beta x^2 [Ip^2 + In^2 + 2 \, Ip \, In \cos(2\omega t + \phi)] \qquad (10)$$

Further, for both current sensors 10 and 50 it can be shown that the average value of the sum of the squared phase currents is proportional to the sum of the squares of the positive, negative and zero order sequence currents. This is shown in equation (11).

$$\overline{I_A^2} + \overline{I_B^2} + \overline{I_C^2} = Ip^2 + In^2 Io^2 \qquad (11)$$

where $\overline{I_A^2}$ is the average value of the square of $I_A \cdot \overline{I_B^2}$ and $\overline{I_C^2}$ are defined in the same fashion. Thus, the sum of the squares of the currents Ix and Iy as given in equation (12) for the current sensor 10 can be written.

$$Ix^2 + Iy^2 = \overline{I_A^2} + \overline{I_B^2} + \overline{I_C^2} + 2 \, Ip \, In \cos(2\omega t + \phi) - Io^2 \qquad (12)$$

Equation (12) can be simplified for the case when the current sensor 50 is used in three phase, three wire system where by definition the zero sequence current Io is zero. This makes the last term on the right side of equation (12) equal to zero. This is shown in equation (13).

$$Ix^2 + Iy^2 = \overline{I_A^2} + \overline{I_B^2} + \overline{I_C^2} + 2 \, Ip \, In \cos(2\omega t + \phi) \qquad (13)$$

The first three terms on the right-hand side of the equation (13) can be considered as a dc term substantially proportional to the average value of the sum of the squares of three line currents. The fourth term on the right-hand side of this equation is an ac term of twice the line frequency and substantially proportional to the product of the positive and negative sequence currents Ip and In, respectively. With a balanced load, the value for the negative sequence current, In, is zero thus making the ac term equal to zero. The separation into a dc term and an ac term proportional to the product of Ip time In is not possible for sensor 50 unless the zero sequence current, Io, is equal to zero because of the last term on the right side of equation (4). When the zero sequence current Io is zero and the indicated relationship between $\beta x$ and $\beta y$ as given in equation (9) is used, equations identical to equations (10)–(13) result for the sensor 50. Although the sensor 50 is simpler than the sensor 10, its use is not recommended in applications where the zero sequence current Io is not known to be zero under all conditions.

Figure 3:
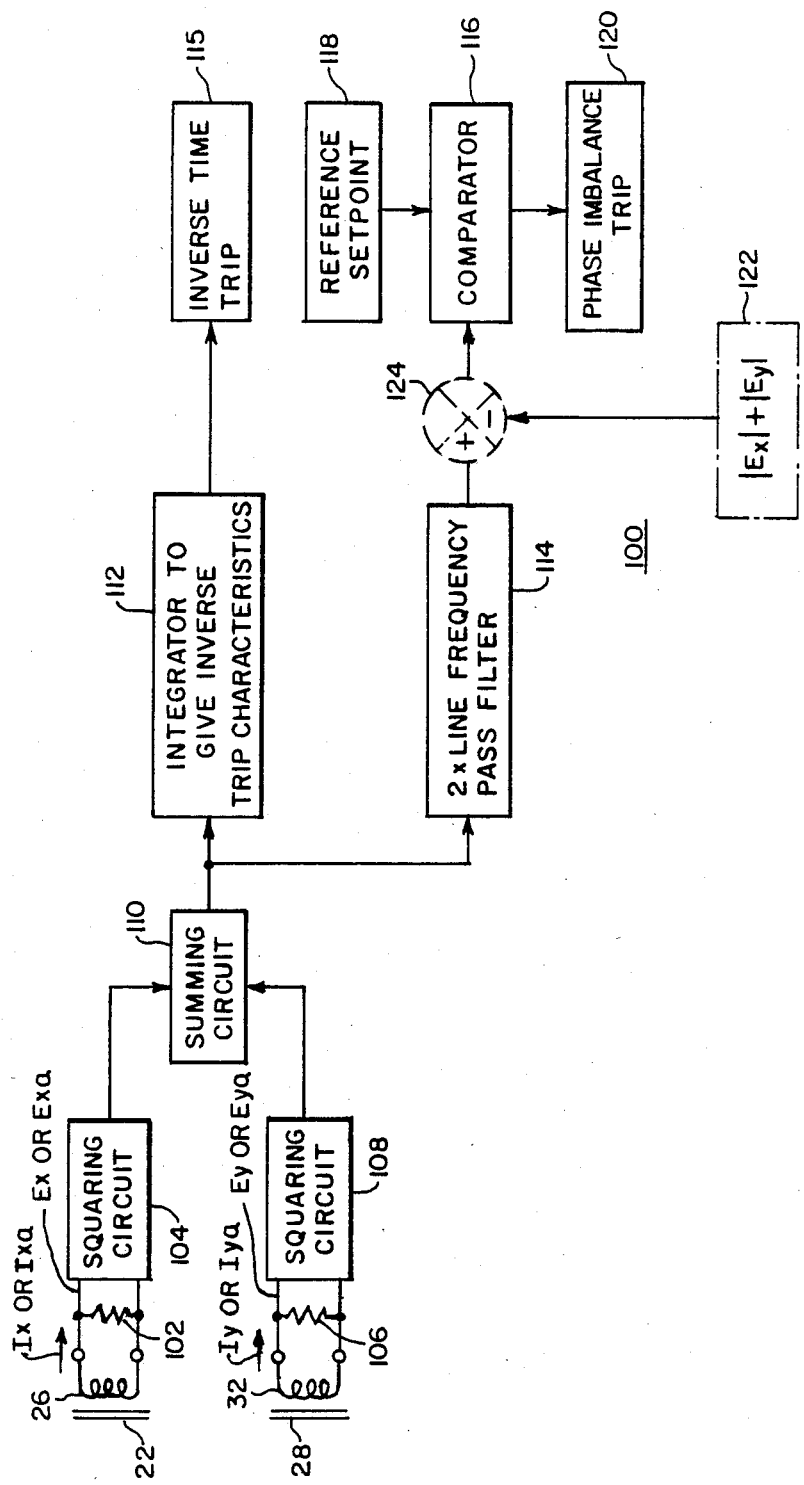
FIG. 3 shows a block diagram using the outputs of the current sensor to generate a signal indicative of the magnitude of the phase current and phase imbalance.

In FIG. 3 a block diagram of a circuit 100 using the output of the current sensor 10 or current sensor 50 is shown. the output current Ix or Ixa of the transformer 12 is passed through resistor 102 providing a voltage Ex or Exa, respectively, that serves as the input to the squaring circuit 104. The output current Iy or Iya is passed through resistor 106 providing the respective voltage Ey or Eya that is the input to the squaring circuit 108. Given the turns ratio relationship as set forth in either equation (8) or equation (9), the values for resistors 102 and 106 would be equal. Alternatively, if the turns ratios of the two transformers are set equal to one another then the values for resistors 102 and 106 would have to be the ratios set forth in either equation (8) or equation (9) for the currents sensors 10 and 50, respectively.

The outputs of the two squaring circuits 104 and 108 are summed together at the summing circuit 110 to produce the signal that is defined in equation (15). This signal is then sent to an integrator 112 and to a two-times-line-frequency pass filter 114. The output of the integrator 112 provides an inverse time trip indication 115 while the output of the pass filter 114 provides a measure of phase imbalance. A comparator 116, having as inputs the output of the pass filter 114 and a reference setpoint 118, provides an output 120 that is a phase inbalance trip indication. In order to provide a substantially constant sensitivity to the phase inbalance over a range of currents, a signal 122 proportional to the sum of the absolute values for Ex and Ey or Exa and Eya that appear at the resistors 102 and 106, respectively, can be subtracted from the output signal of the pass filter 114. This is shown by the dashed-line summing point 124. The circuitry involved with the block diagram is not shown as the various elements contained within the block diagram are well known within the art.

Current transformers are used to illustrate one embodiment of the invention; however, the invention is not limited to devices such as current transformers having magentic cores. In more general terms, the current sensor is a current transducer having a core having a winding disposed thereabout with the core having a window therethrough for receiving one or more current carrying conductors. The core need not necessarily be magnetic nor be a physical structure. In fact, merely an air space inside the winding can serve as an air core. Where a solid core is used, it seves as a support for the windings. In the case of the air core, an integrator circuit is necessary and is used to provide an output voltage proportional to the phase current in the conductors. The air core example can be considered to be a mutal inductor which is described in the copending application previously set forth.

Other embodiments of the invention will be apparent to those skilled in the art from consideration of the specification or from practice of the invention disclosed herein. It is intended that the specification be considered as exemplary only with the scope and spirit of the present invention being indicated by the following claims.

I claim:

1. In a three phase ac system definable by positive, negative and zero sequence currents providing power to an electrical load via a current carrying conductor for each phase where current in the conductors is sensed using current transducers, each current transducer comprising a core having a window therethrough for receiving one or more of the current carrying conductors and having a winding disposed thereon for producing an electrical output signal, a method of producing the electrical output signal indicative of the sum of the three phase current and phase imbalance of the load, comprising the steps of:

provided a first current transducer;

providing a second transducer wherein the number of turns in the winding thereof is substantially equal to $\sqrt{3}$ times the number of turns in the winding of the first current transducer;

passing the conductor of said one of phases twice through the window of the first current transducer;

passing the cunductors of the other two of the phases through the window of the first current transducer such that the current flow therein is in the same direction with respect to one another but opposite in direction to the current flow of the conductor passing twice through the window of the first current transducer;

passing the conductors of the two phases that each pass once through the first current transducer through the window of the second current transducer such that the direction of the current flow in one of the phases is opposite to the direction of current flow of the other phase;

squaring the output of the winding of the first current transducer;

squaring the output of the winding of the second current transducer; and summing together the squared outputs of the first and second current transducers whereby the summed outputs have a dc term substantially proportional to the average value of the sum of the squares of the current flowing in the conductors and an ac term substantially proportional to phase imbalance and being substantially at twice the frequency of the current and substantially proportional to the product of the positive and negative sequence currents.

2. The method of claim 1 further comprising integrating the dc term of the summed outputs whereby the integrated dc term is substantially proportional to an inverse time/current signal.

3. The method of claim 1 further comprising filtering the summed outputs in a two-times-line-frequency pass filter to eliminate the dc term whereby the filtered signal is substantially proportional to the amount of phase inbalance.

4. In a three phase ac system definable with only positive and negative sequence currents for providing power to an electrical load via a current carrying conductor for each phase where current in the conductors is sensed using current transducers, each current transducer comprising a core having a window therethrough for receiving one or more of the current carrying conductors and having a winding disposed thereon for producing an electrical output signal, a method of producing an electrical output signal indicative of the sum of the three phase current and phase imbalance of the load, comprising the steps of:

providing a first current transducer;

providing a second current transducer wherein the number of turns in the winding thereof is substantially equal to $1/\sqrt{3}$ times the number of turns in the winding of the first current transducer;

passing the conductor of one phase of the three phases through the window of the first current transducer;

passing the conductors of the other two phases of the three phases through the window of the second current transducer such that the direction of the current flow in one of the phases where it passes through the window is opposite to the direction of current flow of the other phase;

squaring the output of the winding of the first current transducer;

squaring the output of the winding of the second current transducer; and summing together the squared outputs of the first and second current transducers whereby the summed outputs have a dc term substantially proportional to the average value of the sum of the squares of the current flowing in the conductors and an ac term substantially proportional to phase imbalance and being substantially at twice the frequency of the current and substantially proportional to the product of the positive and negative sequence currents.

5. The method of claim 4 further comprising integrating the dc term of the summed outputs whereby the integrated dc term is substantially proportional to an inverse time/current signal.

6. The method of claim 4 wherein the first and second current transducers provided are current transformers each having a magnetic core.

7. In a three phase ac system definable by positive, negative and zero sequence currents providing power to an electrical load via a current carrying conductor for each phase, a current sensor for producing a signal indicative of the three phase current and phase imbalance of the load, comprising:

a first current transducer comprising a core having a window therethrough for receiving one or more of the current carrying conductors and having a winding disposed thereon for producing a first electrical output signal a second current transducer comprising a core having a window therethrough for receiving one or more of the current carrying conductors and having a winding disposed thereon for producing a second electrical output signal with the number of turns in the winding of the second current transducer being substantially equal to $\sqrt{3}$ times the number of turns in the winding of the first current transformer;

first conductor portion;

a second conductor portion; and a third conductor portion, the first, second and third conductor portions being disposed in series between the line and load, the first conductor portion wound about the core of the first current transducer and passing twice through the window thereof with the second and third current conductor portions passing once through the window of the first current transducer such that the currents flow in the same direction in the second and third conductor portions but opposite to that of the current flowing in the first conductor portion, the second and third conductor portions further passing through the window of the second current transducer such that the direction of current flow in one of the conductor portions where it passes through the window of the second current transducer is opposite in direction to that of the current flow of the other conductor portion passing therethrough whereby the first and second output signals produced are indicative of the three phase current and phase imbalance of the load.

8. The current sensor of claim 7, wherein the first and second current transducers are current transformers each having a magnetic core.

9. In a three phase ac system definable only by positive and negative sequence currents and providing power to an electrical load via a current carrying conductor for each phase, a current sensor for producing a signal indicative of the three phase current and phase imbalance of the load, comprising:

a first current transducer comprising a core having a window therethrough for receiving one or more of the current carrying conductors and having a winding disposed thereon for producing a first electrical output signal;

a second current transducer comprising a core having a window therethrough for receiving one or more of the current carrying conductors and having a winding disposed thereon for producing a second electrical output signal with the number of turns in the winding of the second current transducer being substantially equal to $1/\sqrt{3}$ times the number of turns in the winding of the first current transformer;

a first conductor portion;

a second conductor portion; and a third conductor portion, the first, second and third conductor portions adapted to be received in series between the line and load, the first conductor portion passing through the window of the first current transducer, the second and third conductor portions passing through the window of the second current transducer such that the direction of current flow in one of the conductor portions where it passes through the window of the second current transformer is opposite in direction to that of the other current conductor portion passing therethrough whereby the first and second output signals produced are indicative of the three phase current and phase imbalance of the load.

10. The current sensor of claim 9 wherein the first and second current transducers are current transformers each having a magnetic core.

* * * * *